(12) United States Patent
Van Buel et al.

(10) Patent No.: US 7,349,071 B2
(45) Date of Patent: *Mar. 25, 2008

(54) PRE-ALIGNING A SUBSTRATE IN A LITHOGRAPHIC APPARATUS, DEVICE MANUFACTURING METHOD, AND DEVICE MANUFACTURED BY THE MANUFACTURING METHOD

(75) Inventors: Henricus Wilhelmus Maria Van Buel, Eindhoven (NL); Peter Ten Berge, Eindhoven (NL); Marcus Theodoor Wilhelmus Van Der Heijden, Dilsen-Stokkem (Elen) (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/482,195

(22) Filed: Jul. 7, 2006

(65) Prior Publication Data
US 2007/0019177 A1 Jan. 25, 2007

Related U.S. Application Data

(63) Continuation-in-part of application No. 11/155,885, filed on Jun. 20, 2005.

(51) Int. Cl.
*G03B 27/52* (2006.01)
*G03B 27/42* (2006.01)

(52) U.S. Cl. .......................................... 355/55; 355/53
(58) Field of Classification Search ................. 355/53, 355/55, 67, 72; 356/399–401; 250/548
See application file for complete search history.

(56) References Cited

U.S. PATENT DOCUMENTS

| 5,929,976 | A | * | 7/1999 | Shibuya et al. ................ 355/53 |
| 6,052,173 | A | * | 4/2000 | Miura et al. .................. 355/53 |
| 6,549,648 | B1 | * | 4/2003 | Rinn ........................... 382/151 |
| 6,768,539 | B2 | * | 7/2004 | Gui et al. ...................... 355/53 |
| 7,075,621 | B2 | * | 7/2006 | Mitsui et al. .................. 355/53 |
| 2002/0109825 | A1 | | 8/2002 | Gui et al. |

* cited by examiner

*Primary Examiner*—Henry Hung Nguyen
(74) *Attorney, Agent, or Firm*—Pillsbury Winthrop Shaw Pittman LLP

(57) ABSTRACT

A method of pre-aligning a substrate in a lithographic apparatus is described. The substrate has at least one alignment mark provided on a side of the substrate. The method includes determining a relationship between a position of the at least one alignment mark, at least part of an edge of the substrate, and a center of the substrate. A substrate support is provided to support a substrate, the substrate support having at least one optical view window at a predetermined location to view a part of the side of the substrate. The substrate is placed on the substrate support on the basis of the relationship to position the at least one alignment mark in the at least one optical view window.

19 Claims, 3 Drawing Sheets

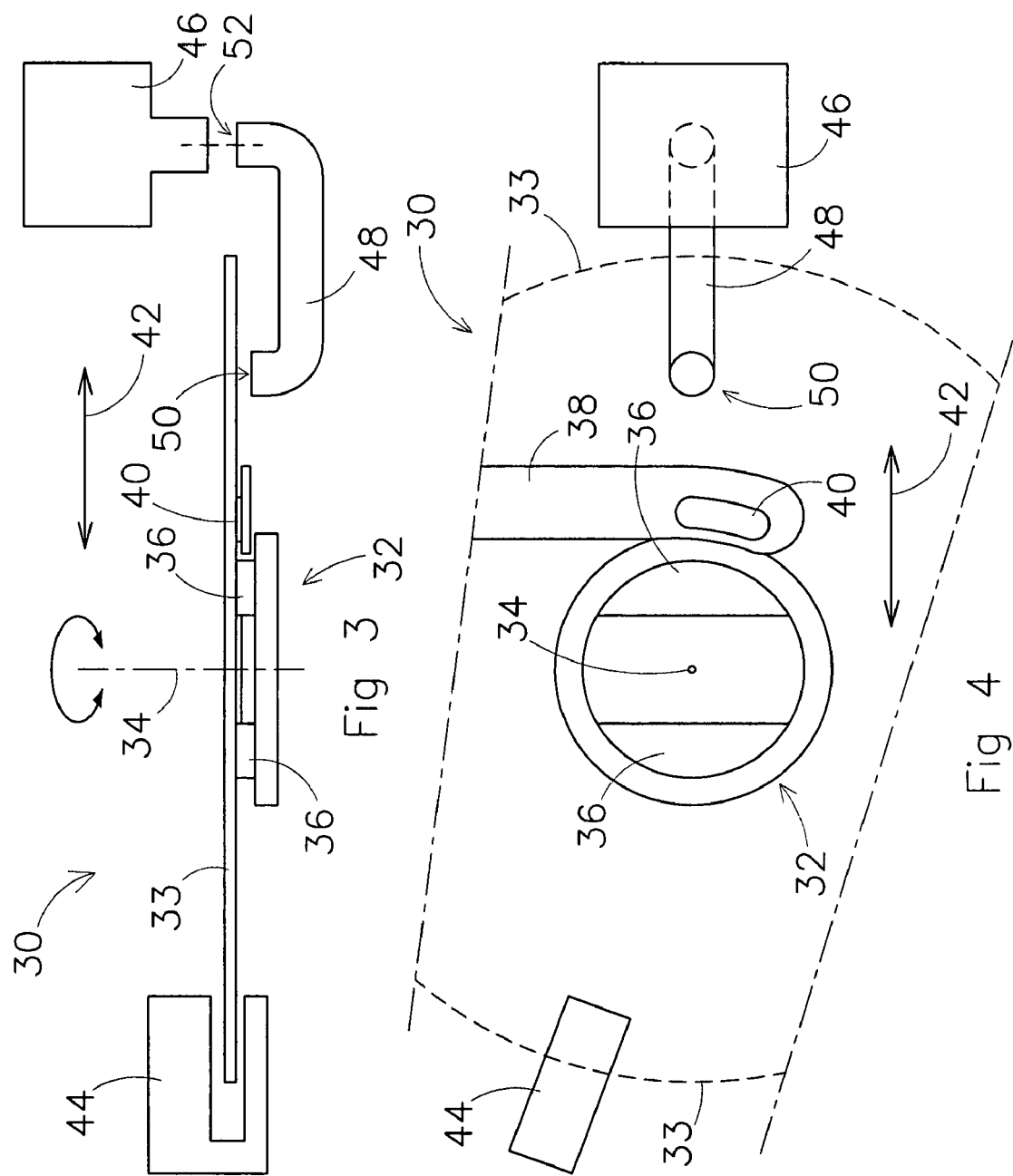

PRE-ALIGNING A SUBSTRATE IN A LITHOGRAPHIC APPARATUS, DEVICE MANUFACTURING METHOD, AND DEVICE MANUFACTURED BY THE MANUFACTURING METHOD

RELATED APPLICATIONS

This Application is a continuation-in-part of U.S. application Ser. No. 11/155,885 filed Jun. 20, 2005, the entire contents of which is hereby incorporated by reference.

BACKGROUND OF THE INVENTION

1. Field of the Invention

The present invention relates to pre-aligning a substrate in a lithographic apparatus, a lithographic apparatus containing an alignment system containing a pre-alignment device configured to perform a pre-alignment method, a device manufacturing method, and a device manufactured according to the device manufacturing method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a manufacturing process using a lithographic projection apparatus, a pattern in a patterning device is imaged onto a substrate positioned on a substrate support. The substrate is at least partially covered by a layer of energy-sensitive material (also termed resist). Prior to, and after this imaging step, the substrate may undergo various procedures, such as a post-exposure bake (PEB), development, a hard bake, and measurement and/or inspection of the imaged features. These procedures are used as a basis to pattern an individual layer of a device, e.g., an integrated circuit (IC). Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate. These devices are then separated from each other by a technique such as dicing or sawing, after which the individual devices can be mounted on a carrier, connected to pins, etc.

Alignment is the process of positioning the image of a specific point on the patterning device to a specific point on the substrate that is to be exposed. Typically, one or more alignment marks, such as a small pattern, are provided on each of the substrate and the patterning device. As indicated above, a device such as an IC may consist of many layers that are built up by successive exposures with intermediate processing steps. Before each exposure, alignment is performed to minimize any positional error between the new exposure and the previous ones, such error being also termed overlay error. A substrate generally may be provided with alignment marks at both sides of the substrate.

An alignment process involves a pre-alignment procedure in which the edge and the center of a (generally circular) substrate are determined, and an alignment procedure in which the substrate is accurately aligned using the one or more alignment marks provided on the substrate. After a substrate has been pre-aligned in a pre-alignment device, the substrate is transferred to a substrate support by a substrate handler, which usually is a robot having an arm for transferring the substrate from the pre-alignment device to the substrate support.

In a pre-alignment procedure, different devices may be used. In a known substrate pre-alignment procedure, a pre-alignment device is used having a pre-alignment support provided with mechanical pins abutting predetermined edge portions of the substrate. Use of such a pre-alignment device presupposes a known diameter of the substrate. If the diameter of the substrate may vary, an offset in the determination of the orientation of the center of the substrate may be introduced, both in terms of an offset in an X direction, an offset in a Y direction, and an offset in a φ (angular) direction (where the substrate essentially extends in an X-Y plane, and φ denotes an angle of rotation of the center of the substrate). In fact, the offset defines a difference between the substrate's geometrical coordinate system and a coordinate system based on the alignment marks provided on the substrate. The offset may be determined when the diameter of the substrate is known. Alternatively, a pre-alignment device may be used having a substrate edge detector relative to which the substrate is rotated on a pre-alignment support of the pre-alignment device. By rotating the substrate and simultaneously measuring the location of the edge, a center X, Y and φ offset may be determined. As a further alternative, a pre-alignment device may be used having a number of spaced substrate edge detectors located along an expected edge portion of a substrate. No rotation of the substrate is necessary to determine a center of substrate, although, if the diameter of the substrate may vary, an X, Y, and φ offset in the determination of the orientation of the center of the substrate may be introduced. These offsets may be determined when the diameter of the substrate is known.

Once the offset referred to above has been determined, an orientation of the particular substrate can be chosen such that the substrate may be placed correctly on a substrate support to perform an alignment procedure.

Following a pre-alignment procedure, in an alignment procedure of a substrate on a substrate support, the image of an alignment mark on the patterning device is positioned accurately to an image of an alignment mark on the substrate.

It is observed that in some technologies, such as micro system technology (MST) and micro electromechanical systems (MEMS), devices are fabricated from both sides of a substrate. Exposures performed on one side of the substrate must be accurately aligned with features previously exposed on the other side of the substrate.

Throughout this specification, reference to an alignment mark being on a particular side of the substrate of course includes the alignment mark being etched into that side of the substrate, and includes the alignment mark having subsequent material deposited on top of it such that it is embedded and is no longer necessarily exposed at the surface.

U.S. Patent Application Publication No. 2002/0109825 A1, which hereby is incorporated by reference in its entirety, discloses a lithographic apparatus which is provided with an optical system, such as a system employing one or more laser beams, built into a substrate table for producing an image of an alignment mark that is provided on the backside of the substrate, i.e., the side of the substrate which is facing the substrate table. The image is located at the plane of the front side of the substrate, and can be viewed by an alignment system from the front side of the substrate. Simultaneous alignment between marks on the back and front of the substrate and a patterning device can be performed using a pre-existing alignment system.

In a production facility where substrates are processed to yield devices, lithographic equipment of different suppliers may be used. The different suppliers generally employ different pre-alignment procedures to determine the edge and the center of the substrate prior to an alignment procedure based on the recognition of one or more alignment marks on the substrate. Therefore, unexpected or at least basically unknown position deviations of the alignment marks may be encountered when processing substrates on different equipment. Moreover, when using one or more alignment marks (sometimes also referred to as alignment targets) on the backside of a substrate, there is a restriction in the positioning of such alignment marks. This restriction stems from the limited physical size of a view window of the optical system used for determining the position of the alignment marks. A pre-alignment method therefore should be designed to place a substrate on a substrate support such that the alignment marks on the backside of a substrate may be viewed in the view window of the optical system, despite the use of lithographic equipment from different suppliers used to produce specific devices.

SUMMARY OF THE INVENTION

It is desirable to provide a pre-alignment method and apparatus allowing the use of equipment from different suppliers while avoiding elaborate pre-alignment processes.

In an aspect of the invention, a method of pre-aligning a substrate in a lithographic apparatus is provided, the substrate having at least one alignment mark provided on a side of the substrate, the method comprising: determining a relationship between a position of the at least one alignment mark, at least part of an edge of the substrate, and a center of the substrate; providing a substrate support to support a substrate, the substrate support having at least one optical view window at a predetermined location to view a part of the side of the substrate; and placing the substrate on the substrate support on the basis of the relationship to position the at least one alignment mark in the at least one optical view window.

According to embodiment of the invention, one or more alignment marks are provided on a side of the substrate in a marking apparatus, such as a lithographic apparatus or other suitable apparatus. By determining the relationship between a position of the at least one alignment mark, the edge and the center of the substrate, and using this relationship when placing, e.g., by a controllable handling apparatus, the substrate on a substrate support of a lithographic apparatus with known characteristics, which may be different from those of the marking apparatus, a substrate may be correctly pre-aligned on the substrate support, with the one or more alignment marks located in a view window of an alignment system of the lithographic apparatus. The relationship may include data indicating a translation and a rotation of a substrate around its center. The data may be stored in, or input to, a control system of the lithographic apparatus.

In another aspect of the invention, a method of pre-aligning a substrate is provided, the method comprising: determining a position of at least part of an edge of the substrate, and a center of the substrate; predetermining a relationship between a position of at least one alignment mark, the at least part of the edge of the substrate, and the center of the substrate; providing the at least one alignment mark on a side of the substrate on the basis of the relationship; providing, in a lithographic apparatus, a substrate support to support a substrate, the substrate support having at least one optical view window at a predetermined location to view a part of the side of the substrate; and placing the substrate on the substrate support to position the at least one alignment mark in the at least one optical view window of the substrate support.

Here, a particular location of the one or more alignment marks may be chosen on the basis of a desired relationship such as to conform to the requirements of a lithographic apparatus in which the substrate is to be processed such as to correctly pre-align the substrate on the substrate support, with the one or more alignment marks located in a view window of an alignment system of the lithographic apparatus. Again, the relationship may include data indicating a translation and a rotation of a wafer around its center, now prior to applying the one or more alignment marks.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 is a schematic side view illustrating a pre-alignment device according to an embodiment of the invention;

FIG. 4 is a schematic top view of the pre-alignment device of FIG. 3.

DETAILED DESCRIPTION OF EMBODIMENTS OF THE INVENTION

Figure 1:
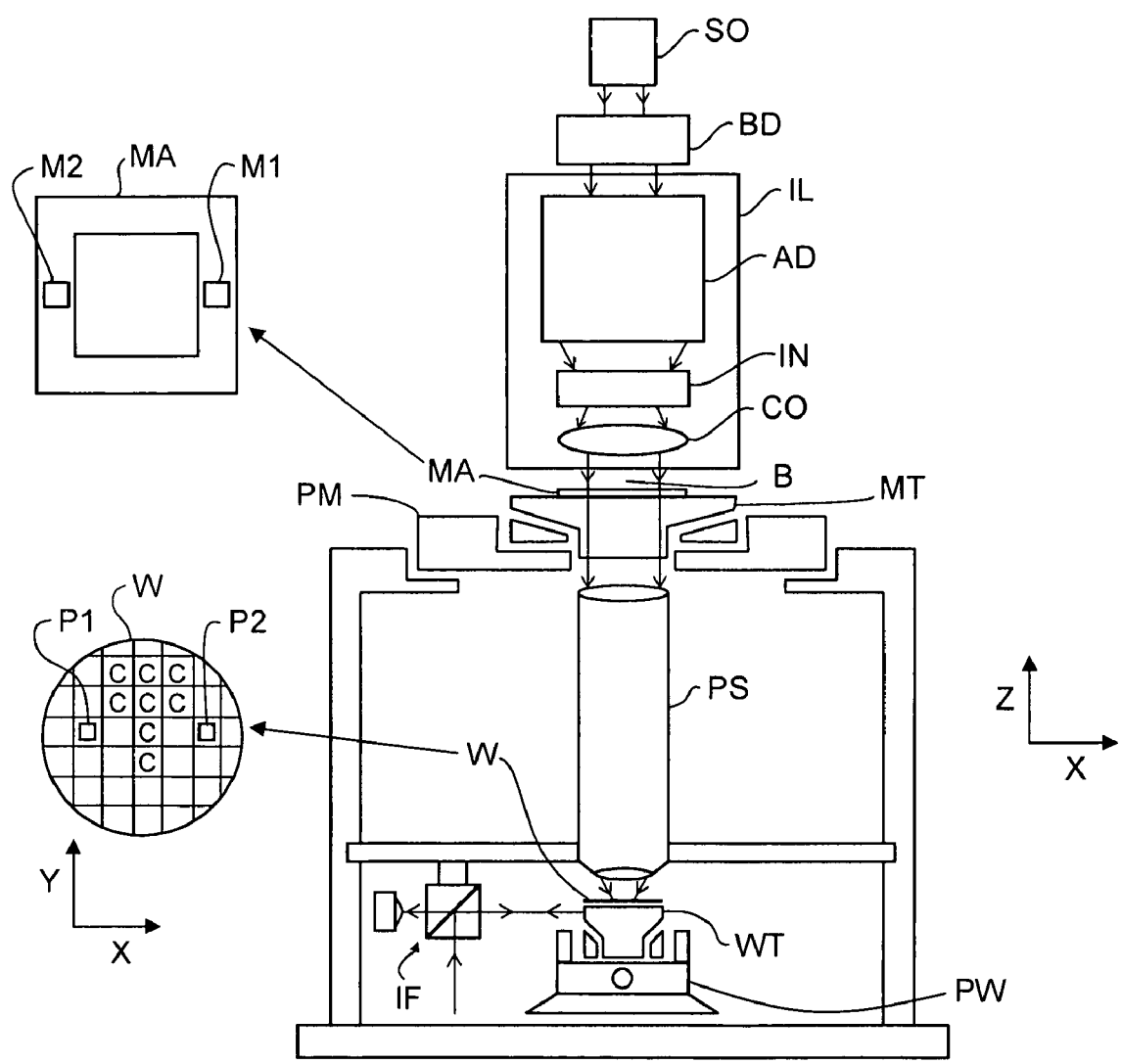
FIG. 1 depicts a lithographic projection apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

As explained above, the lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
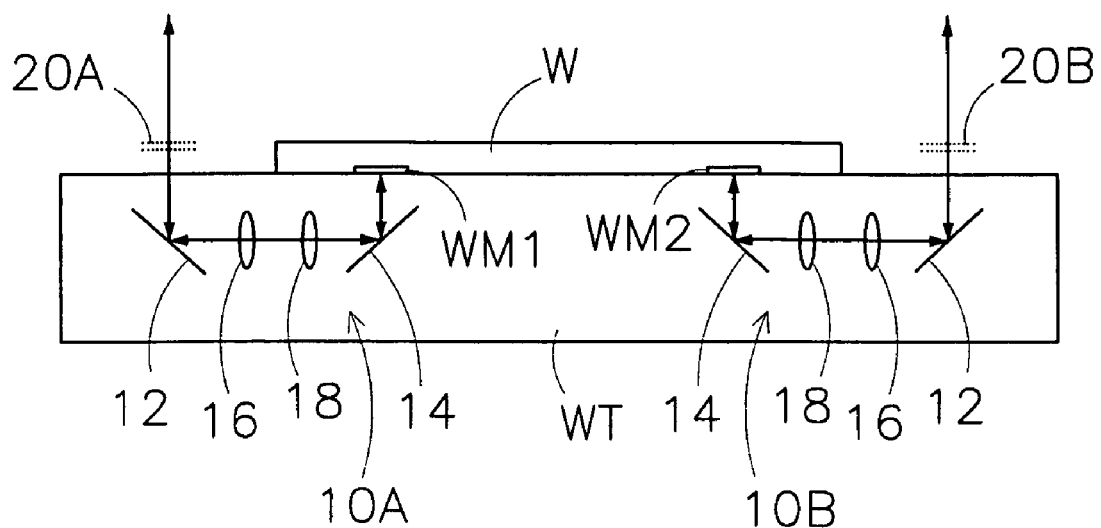
FIG. 2 is a schematic cross-section illustrating a substrate support according for use in the invention.

FIG. 2 shows a wafer W on a wafer table WT, also termed hereinafter: substrate support. Wafer marks WM1 and WM2 are provided on a side ("back side") of the wafer W. An optical system is built into the wafer table WT for providing optical access to the wafer marks WM1, WM2 on the back side of the wafer W. The optical system comprises one arm or a plurality of arms 10A, 10B. Each arm may consist of two mirrors 12, 14 and two lenses 16, 18. The mirrors 12, 14 in each arm are inclined such that the sum of the angles that they make with the horizontal is 90°. In this way, a beam of light impinging vertically on one of the mirrors will remain vertical when reflected off the other mirror.

In use, light is directed from above the wafer table WT onto a mirror 12, through lenses 16 and 18, onto mirror 14 and then onto the respective wafer mark WM1, WM2. Light is reflected off portions of the wafer mark and returns along an arm of the optical system via mirror 14, lenses 18 and 16, and mirror 12. The mirrors 12, 14 and lenses 16, 18 are arranged such that an image 20A, 20B of the wafer mark WM1, WM2 is formed at the plane of the front (top) surface of the wafer W, corresponding to the front side of the wafer W. The order of the lenses 16, 18 and the mirrors 12, 14 may be different, as appropriate to the optical system. For example, lens 18, could be between the mirror 14 and the wafer W. Also, in an arm any other number of lenses may be used.

It is observed that the arms of the optical system may have different orientations as seen in a plane parallel to the back side of the wafer W, while one end of an arm is situated such that it is below the wafer W, and the opposite end of the arm is situated in the area of the wafer table WT not (fully) covered by the wafer W. It is further noted that the mirrors 12, 14 of an arm of the optical system need not be provided as discrete components, but may be integral with the wafer table WT. For this purpose, appropriate faces may be machined into the wafer table WT, which then may be provided with a coating to improve reflectivity, thus forming the mirrors 12, 14. As a further alternative, the arms of the optical system may be embodied using optical fibers or coherent optical fiber bundles, and lenses to couple radiation into and out of the fibers.

An alignment system for performing an accurate alignment (following a pre-alignment) may be a through-the-lens (TTL) arrangement, such that the lens system PL between the mask MA and the wafer W is actually the projection lens used for the exposure radiation. However, the alignment system can also be off-axis (OA).

In the method according to an embodiment of the invention, a relationship between the position of at least one alignment mark on a substrate, at least part of an edge of the substrate, and a center of the substrate is to be determined. Such a relationship may be expressed in data which describe an offset between a geometrical coordinate system and an alignment coordinate system coupled to the at least one alignment mark. The offset may be expressed in terms of a translation and a rotation value. The translation value may be a distance between a center of the geometrical coordinate system and a center of the alignment coordinate system, expressed in an X coordinate and a Y coordinate, where the translation is in a X-Y plane. The rotation value may be an angle of rotation around one of the centers, expressed in an angle of rotation $\phi$, where at least part of the edge of the substrate (such as a notch or a flat edge part) may determine a reference angle. This relationship may be established in various ways.

One way of determining a relationship between the position of at least one alignment mark on a substrate, at least part of an edge of the substrate, and a center of the substrate may be seen in performing off-line measurements of the positions on a plurality of substrates, determining an average value of offsets of an X position, a Y position and an angle of rotation $\phi$ of a center of the substrates, and storing the average offset values for the plurality of substrates. Each substrate will have the same (average) relationship assigned to it.

Instead of determining average values for a plurality of substrates, a specific set of values X, Y and $\phi$ may be determined for each substrate in an off-line measurement, coupling each set of values to the corresponding substrate, which may be identified by a suitable identifier assigned to it.

An alternative way of determining a relationship between the position of at least one alignment mark on a substrate, at least part of an edge of the substrate, and a center of the substrate may be seen in predetermining this relationship in terms of a selected set of values X, Y and $\phi$ previous to providing an alignment mark on the substrate, and only then providing the at least one alignment mark on the substrate in correspondence with the predetermined set of values. This may also be regarded as an off-line procedure.

A further way of determining a relationship between the position of at least one alignment mark on the substrate, at least part of an edge of the substrate, and a center of the substrate may be seen in determining a specific set of values X, Y and φ in an in-line measurement in a pre-alignment device of a lithographic apparatus, before an exposure of the substrate takes place. When the alignment mark is provided at a side (also called: backside) of the substrate opposite to the exposed side of the substrate, the pre-alignment device requires a mark sensor configured to capture an image of the alignment mark while the alignment mark is facing a pre-alignment support. Further details of a pre-alignment device are disclosed below.

FIGS. 3 and 4 illustrate a pre-alignment device 30 for performing a pre-alignment procedure to be elucidated below. The pre-alignment device 30 includes a pre-alignment support 32 for supporting a substrate 33 (in FIG. 4 the substrate is indicated with broken lines), the pre-alignment support 32 being rotatable around an axis 34 such that an angle of rotation of the pre-alignment support 32 may be measured and controlled in a manner known per se, and not shown or explained in more detail. The pre-alignment support 32 includes vacuum chambers 36 which are open at the side facing the substrate 33. By lowering a gas pressure in the vacuum chambers 36 relative to the ambient gas pressure, the substrate 33 may be engaged fixedly on the pre-alignment support 32. The pre-alignment device 30 further includes an arm-shaped translation actuator 38 having a vacuum chamber 40 which is open at a side facing the substrate 33. The translation actuator 38 is movable in the directions of double arrow 42 by drive devices known per se, and not shown or explained in more detail. The movement of the translation actuator 38 may be measured and controlled in a manner known per se, and not shown or explained in more detail. By lowering a gas pressure in the vacuum chamber 40 relative to the ambient gas pressure, the substrate 33 may be engaged fixedly on the translation actuator 38 (while at the same time disengaging the substrate 33 from the pre-alignment support 32) and translated as required. On the other hand, the substrate 33 will be disengaged from the translation actuator while being engaged on the pre-alignment support.

The pre-alignment device 30 further includes an edge sensor 44, e.g., embodied as a linear CCD (Charge Coupled Device) sensor, mounted on a structure not shown on which also the pre-alignment support 32 is mounted. The edge sensor 44 may optically measure part of the edge of the substrate 33 located in a recess of the edge sensor 44. By rotating the substrate 33 fixedly engaged on the pre-alignment support 32, a predetermined part of the edge of the substrate 33 may be measured, and from the data produced by the edge sensor, a geometrical center of the substrate 33 may be determined, as well as the location of a specific edge part such as a notch or a flat edge part (in practice also referred to as 'flat').

The pre-alignment device 30 further includes an optical mark sensor 46 interacting with an optical device 48. The optical device 48 basically corresponds to an optical arm 10A or 10B shown in FIG. 2, and has an alignment mark end 50 and a mark sensor end 52. The alignment mark end 50 is configured for taking an image of the side of the substrate facing the pre-alignment support 32. The mark sensor end 52 is configured to provide the image to the mark sensor 46.

In an embodiment, the alignment mark end 50 of the optical device 48 may be moved relative to the pre-alignment support 32 in the directions of double arrow 42 to scan a ring-shaped or ring-section shaped area of the backside of the substrate 33 (when rotating the substrate 33) in order to locate an alignment mark provided on the backside of the substrate 33. In a further embodiment, the optical device 48 may be moved as a whole relative to the pre-alignment support 32 in the directions of double arrow 42 to scan a ring-shaped or ring-section shaped area of the backside of the substrate 33 (when rotating the substrate 33) in order to locate an alignment mark provided on the backside of the substrate 33. In a further embodiment, the mark sensor 46 may be moved relative to the optical device 48 in the directions of double arrow 42 to scan a ring-shaped or ring-section shaped area of the backside of the substrate 33 (when rotating the substrate 33) in order to locate an alignment mark provided on the backside of the substrate 33. In a further embodiment, a combination of two or three of these movements may be established. In any of these movements, the position of the moving part is measured and controlled.

With the measurements made by the edge sensor 44, and the combination of the mark sensor 46 and the optical device 48, a relationship between the position of at least one alignment mark on (the backside of) the substrate 33, at least part of an edge of the substrate 33, and a center of the substrate 33 may be determined, and may be expressed in a set of offset values X, Y, and φ for the particular substrate 33, where the substrate extends in an X-Y plane, and axis 34 is an axis of rotation.

In a formula, a substrate center offset Δx, Δy of a substrate having a diameter $D_w$ may be expressed as $$\begin{pmatrix} \Delta x \\ \Delta y \end{pmatrix} = (D_W - D_n) * \begin{pmatrix} a \\ b \end{pmatrix} + \begin{pmatrix} e \\ f \end{pmatrix}$$

where $D_n$ is a normalization constant, and a, b, e, and f are process parameters being a function of the used lithographic apparatus. In case a substrate is used with a substrate reference side part (notch or flat), the substrate center offset Δx, Δy of a substrate having a distance $d_w$ between the reference side part and the wafer center, may be expressed as $$\begin{pmatrix} \Delta x \\ \Delta y \end{pmatrix} = (d_W - d_n) * \begin{pmatrix} c \\ d \end{pmatrix} + \begin{pmatrix} e \\ f \end{pmatrix}$$

where $d_n$ is a normalization constant, and c, d, e, and f are process parameters being a function of the used lithographic apparatus. The normalization constants $D_n$ and $d_n$ are size values of a calibration or normalization substrate.

Subsequently, a desired orientation of the substrate 33 may be established by the pre-alignment device 30 while the substrate still is supported in the pre-alignment device 30, before a transfer of the substrate from the pre-alignment support 32 to the substrate support WT takes place, such that the at least one alignment mark will be positioned in the at least one optical view window of the substrate support. In this process, a control device is used to control an angle of rotation of the pre-alignment support 32, and a translation of the translation device 38 on the basis of measurements from the edge sensor 44 and the mark sensor 46. To reach a desired orientation in the pre-alignment device 30, the translation actuator 38 may be used to provide a required translation, and the pre-alignment support 32 may be used to provide a required rotation. This procedure allows for a transfer using a simple transfer structure, such as a pick and place robot (not shown in detail).

Further, the substrate 33 may be transferred by the transfer structure from the pre-alignment device 30 to the substrate support WT without first establishing a desired orientation of the substrate 33. In this situation, the desired orientation is established by the transfer structure after taking the substrate 33 from the pre-alignment device 30, and before bringing the substrate 33 into contact with the substrate support WT such that the at least one alignment mark is positioned in the at least one optical view window of the substrate support. This procedure requires a transfer structure configured to set a desired orientation during the transfer of the substrate 33 from the pre-alignment device 30 to the substrate support WT.

Substrates produced on an apparatus of one supplier may be processed on an apparatus of a different supplier using the pre-alignment method and device according to embodiments of the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of pre-aligning a substrate in a lithographic apparatus, the substrate having an alignment mark provided on a backside of the substrate, the method comprising:
    determining a relationship between a position of the alignment mark, at least part of an edge of the substrate, and a center of the substrate; and
    placing the backside of the substrate on a substrate support on the basis of said relationship to position the alignment mark in an optical view window of the substrate support, the optical view window arranged in the substrate support at a predetermined location to view a part of the backside of the substrate.

2. The method of claim 1, wherein following said determining, and prior to said placing, the substrate is repositioned on the basis of said relationship.

3. The method of claim 2, wherein said determining is performed in a pre-alignment device, and the pre-alignment device is configured to reposition the substrate on the basis of said relationship.

4. The method of claim 1, wherein in said determining, the edge of the substrate and at least part of said backside of the substrate containing the alignment mark is scanned.

5. The method of claim 4, wherein the determining includes rotating the substrate.

6. The method of claim 1, wherein said relationship includes a translation and a rotation value.

7. The method of claim 1, wherein said relationship is determined as an average for a plurality of substrates.

8. The method of claim 1, wherein the determining includes measuring an edge of the substrate to determine a geometrical center of the substrate.

9. The method of claim 1, wherein the determining includes rotating the substrate and scanning the backside of the substrate along a radial direction of the substrate to locate a position of the alignment mark.

10. The method of claim 9, wherein the scanning includes imaging the backside of the substrate.

11. A lithographic apparatus comprising:
    a radiation system to condition a beam of radiation;
    a patterning support to support a patterning structure to pattern the beam of radiation according to a desired pattern;
    a substrate support to support a substrate, the substrate support having an optical view window at a predetermined location to view a part of a backside of the substrate;
    a projection system to project the patterned beam of radiation onto a target portion of the substrate;
    an alignment system to align a pattern of the patterning structure with an alignment mark provided on the backside of the substrate, using alignment radiation, the alignment system comprising a pre-alignment device including
        (a) a computer program stored in a storage medium and including instructions configured to determine a relationship between a position of the alignment mark, at least part of the edge, and a center of the substrate; and (b) a transfer unit configured to place the substrate on the substrate support on the basis of said relationship to position the alignment mark in the optical view window.

12. The apparatus of claim 11, further comprising an optical system to transmit an image of the alignment mark from the backside of the substrate opposite the target portion for use by the alignment system.

13. A device manufacturing method comprising:
(a) determining a relationship between a position of an alignment mark provided on a backside of a substrate, at least part of an edge of the substrate, and a center of the substrate;
(b) placing the backside of the substrate on a substrate support on the basis of said relationship to position the alignment mark in an optical view window of the substrate support, the optical view window arranged in the substrate support at a predetermined location to view a part of the backside of the substrate;
(c) transmitting an image of the alignment mark from the backside of the substrate for use in an aligning; and
(d) aligning the image of the alignment mark with a pattern of a patterning structure used in projecting a patterned beam of radiation onto a target area of a layer of radiation-sensitive material on a front side of the substrate opposite the backside.

14. A pre-alignment device configured to pre-align a substrate in a lithographic apparatus prior to placing the substrate on a substrate support of the lithographic apparatus, the substrate having an alignment mark provided on a backside of the substrate, the pre-alignment device comprising:
a rotatable pre-alignment support to support the substrate;
an edge sensor to measure at least part of an edge of the substrate;
a mark sensor and an optical device to measure a position of the alignment mark located on the backside of the substrate that faces the pre-alignment support;
a control device to control an angle of rotation of the pre-alignment support and a translation of the substrate on the basis of measurements from the edge sensor and the mark sensor.

15. The pre-aligument device of claim 14, further comprising a translation device to translate the substrate.

16. The pre-alignment device of claim 15, wherein the pre-alignment support has an axis of rotation, and wherein at least one of the mark sensor and the optical device or a part thereof is movable radially relative to the axis of rotation.

17. A lithographic apparatus comprising:
a radiation system to condition a beam of radiation;
a patterning support to support a patterning structure to pattern the beam of radiation according to a desired pattern;
a substrate support to support a substrate, the substrate support having an optical view window at a predetermined location to view a part of a backside of the substrate;
a projection system to project the patterned beam of radiation onto a target portion of the substrate;
an alignment system to align a pattern of the patterning structure with an alignment mark provided on the backside of the substrate, using alignment radiation, the alignment system comprising a pre-alignment device configured to pre-alian the substrate prior to placing the substrate on the substrate support, the pre-alignment device including:
a rotatable pre-alignment support to support the substrate;
an edge sensor to measure at least part of an edge of the substrate;
a mark sensor and an optical device to measure a position of the alignment mark located on the backside of the substrate that faces the pre-alignment support;
a control device to control an angle of rotation of the pre-alignment support and a translation of the substrate on the basis of measurements from the edge sensor and the mark sensor.

18. The apparatus of claim 17, further comprising a translation device to translate the substrate.

19. The apparatus of claim 17, wherein the pre-alignment support has an axis of rotation, and wherein at least one of the mark sensor and the optical device or a part thereof is movable radially relative to the axis of rotation.

* * * * *